US008987795B2

(12) United States Patent
Aoki

(10) Patent No.: US 8,987,795 B2
(45) Date of Patent: Mar. 24, 2015

(54) SOLID-STATE IMAGING DEVICE AND IMAGING APPARATUS

(71) Applicant: Olympus Corporation, Tokyo (JP)

(72) Inventor: Jun Aoki, Tokyo (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 13/961,456

(22) Filed: Aug. 7, 2013

(65) Prior Publication Data

US 2014/0042577 A1 Feb. 13, 2014

(30) Foreign Application Priority Data

Aug. 10, 2012 (JP) .................. 2012-178741

(51) Int. Cl.
*H01L 31/062* (2012.01)
*H01L 27/146* (2006.01)
(52) U.S. Cl.
CPC ...... *H01L 27/14627* (2013.01); *H01L 27/1461* (2013.01); *H01L 27/14612* (2013.01); *H01L 27/14629* (2013.01); *H01L 27/14634* (2013.01); *H01L 27/14636* (2013.01); *H01L 27/14621* (2013.01)
USPC ................. 257/292; 257/294; 257/E27.127
(58) Field of Classification Search
CPC ................ H01L 27/1461; H01L 27/14612; H01L 27/14629; H01L 27/14627; H01L 27/14621
USPC ......... 257/291, 292, 294, 431, 432, 433, 443, 257/E31.127, E31.083, E27.133, E27.13
See application file for complete search history.

(56) References Cited

U.S. PATENT DOCUMENTS

| 7,816,713 B2 * | 10/2010 | Kim et al. ..................... 257/291 |
| 8,155,456 B2 | 4/2012 | Babacan et al. |
| 8,809,922 B2 * | 8/2014 | Moriya et al. ................ 257/291 |
| 2009/0179238 A1 * | 7/2009 | Hara et al. ..................... 257/291 |
| 2011/0146756 A1 * | 6/2011 | Sasaki et al. .................. 136/246 |
| 2011/0180688 A1 * | 7/2011 | Nakahara .................. 250/208.1 |
| 2013/0235237 A1 * | 9/2013 | Aoki ............................ 348/294 |
| 2014/0008745 A1 * | 1/2014 | Maruyama ................... 257/431 |

* cited by examiner

*Primary Examiner* — Cuong Q Nguyen
*Assistant Examiner* — Yosef Gebreyesus
(74) *Attorney, Agent, or Firm* — Westerman, Hattori, Daniels & Adrian, LLP

(57) ABSTRACT

A first substrate has a plurality of photoelectric conversion units arranged in two dimensions. A second substrate has a plurality of photoelectric conversion units arranged in two dimensions. A plurality of photoelectric conversion units are arranged in a region of the second substrate corresponding to a region of the first substrate where one photoelectric conversion unit is arranged. The imaging signals based on signal charges stored in the photoelectric conversion units and the light field signals based on signal charges stored in the photoelectric conversion units are read.

10 Claims, 6 Drawing Sheets

SOLID-STATE IMAGING DEVICE AND IMAGING APPARATUS

BACKGROUND OF THE INVENTION

1. Field of the Invention

The present invention relates to a solid-state imaging device that has a plurality of substrates and acquires imaging signals and light field signals, and an imaging apparatus that includes the solid-state imaging device.

Priority is claimed on Japanese Patent Application No. 2012-178741, filed Aug. 10, 2012, the contents of which are incorporated herein by reference.

2. Description of Related Art

In recent years, generally, video cameras, electronic still cameras, or the like have been widely prevalent. Charge coupled device (CCD) type or amplified solid-state imaging devices are used for these cameras. The amplified solid-state imaging devices guide a signal charge, which is generated and stored by a photoelectric conversion unit of a pixel on which light is incident, to an amplifying unit provided in the pixel, and output a signal, which is amplified by the amplifying unit, from the pixel. In the amplified solid-state imaging devices, a plurality of such pixels are arranged in a two-dimensional matrix. In the amplified solid-state imaging devices, for example, a CMOS type solid-state imaging device using complementary metal oxide semiconductor (CMOS) transistors is known.

Additionally, a solid-state imaging device aiming at not only obtaining imaging signals on the CMOS type solid-state imaging device but also at obtaining light field signals to obtain the depth information on a subject is disclosed in the specification of U.S. Pat. No. 8,155,456. In the specification of U.S. Pat. No. 8,155,456, pixels for obtaining the imaging signals and pixels for obtaining the light field signals are the same.

SUMMARY OF THE INVENTION

A solid-state imaging device related to a first aspect of the present invention includes a first substrate that has a plurality of first photoelectric conversion units arranged in two dimensions; a second substrate that has a plurality of second photoelectric conversion units arranged in two dimensions and is stacked on the first substrate; and a selector that selects the angle of a light ray that is transmitted through the first substrate and is incident on the second photoelectric conversion units. The plurality of second photoelectric conversion units are arranged in a region of the second substrate corresponding to a region of the first substrate where one first photoelectric conversion unit among the plurality of first photoelectric conversion units is arranged, and imaging signals based on signal charges stored in the first photoelectric conversion units are read and light field signals based on signal charges stored in the second photoelectric conversion units are read.

According to a second aspect of the present invention, in the first aspect, the first substrate may further include a transmission unit that transfers the signal charges stored in the first photoelectric conversion units to the second substrate, and the second substrate may further include a first reading unit that reads the imaging signals based on the signal charges transferred by the transmission unit, and a second reading unit that reads the light field signals based on the signal charges stored in the second photoelectric conversion units.

According to a third aspect of the present invention, in the first aspect, the solid-state imaging device may further include a third substrate, the first substrate may further include a first transmission unit that transfers the signal charges stored in the first photoelectric conversion units to the second substrate, the second substrate may further include a second transmission unit that transfers the signal charges transferred by the first transmission unit to the third substrate; and a third transmission unit that transfers the signal charges stored in the second photoelectric conversion units to the third substrate, and the third substrate may include a first reading unit that reads the imaging signals based on the signal charges transferred by the second transmission unit; and a second reading unit that reads the light field signals based on the signal charges transferred by the third transmission unit.

According to a fourth aspect of the present invention, in any one of the first aspect to third aspect, the selector may include a micro lens that is provided on the first substrate and condenses light incident on the first photoelectric conversion units; and a light pipe that is provided at the first substrate and guides the light condensed by the micro lens to a region of the second substrate where the second photoelectric conversion units are arranged.

According to a fifth aspect of the present invention, in the fourth aspect, the light pipe may be an insulator.

A solid-state imaging device related to a sixth aspect of the present invention includes a first substrate that has a plurality of first photoelectric conversion units arranged in two dimensions; a second substrate that has a plurality of second photoelectric conversion units arranged in two dimensions and is stacked on the first substrate; and a selector that selects the angle of a light ray that is transmitted through the first substrate and is incident on the second photoelectric conversion units. The plurality of second photoelectric conversion units are arranged in a region of the second substrate corresponding to a region of the first substrate where one first photoelectric conversion unit among the plurality of first photoelectric conversion units is arranged, and imaging signals based on signal charges stored in the first photoelectric conversion units are read and light field signals based on signal charges stored in the second photoelectric conversion units are read.

DETAILED DESCRIPTION OF THE INVENTION

Figure 1:
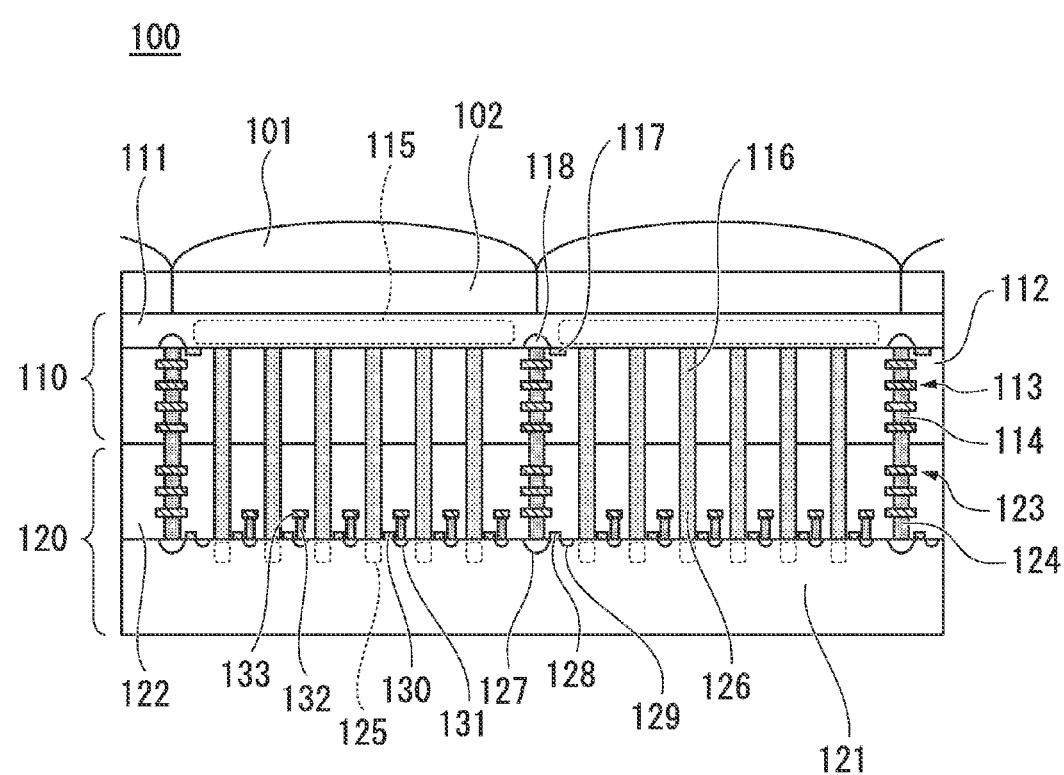
FIG. 1 is a partial cross-sectional view of a solid-state imaging device according to the first embodiment of the present invention.

Embodiments of the present invention will be described below referring to the drawings.

First Embodiment

A first embodiment of the present invention will be described hereinafter. FIG. 1 shows the configuration of a solid-state imaging device 100 according to the present embodiment in a cross-sectional view. The solid-state imaging device 100 is configured to have a first substrate 110 where a plurality of photoelectric conversion units 115 (first photoelectric conversion units) are formed, and a second substrate 120 where a plurality of photoelectric conversion units 125 (second photoelectric conversion units), MOS transistors for reading signals, and the like are formed. The first substrate 110 and the second substrate 120 have a stacked structure, the stacked structure is that the first substrate 110 is overlapped on the second substrate 120, and are overlapped on each other and bonded together so that mutual principal surfaces face each other. Light is incident from the upper side (first substrate 110 side) of FIG. 1. The solid-state imaging device 100 has a micro lens 101 (selector) that images the light from a subject, and the micro lens 101 is provided on the front surface of the first substrate 110. Additionally, a color filter 102 corresponding to a predetermined color is formed between the first substrate 110 and the micro lens 101.

As shown in FIG. 1, the first substrate 110 is configured to have a semiconductor substrate 111 where the photoelectric conversion units 115 and a floating diffusion layer 118 are formed, and a multilayer wiring layer. The multilayer wiring layer has an insulating film 112, a wiring layer 113, a via 114, a light pipe 116 (selector), and a transfer transistor 117 (gate electrode). The photoelectric conversion units 115 are, for example, buried photodiodes configured by an N-type well that is formed in a P-type well layer and a P+-type impurity region that has contact with the N-type well and is formed on the surface side of the P-type well layer.

The wiring layer 113 is stacked via the insulating film 112, and forms the multilayer wiring layer by connecting respective wiring layers by means of the via 114. In FIG. 1, four wiring layers 113 are formed. Since the wiring layers 113 are used for transmission of signals within the first substrate 210 or supply of a power-source voltage or a ground voltage, the wiring layers are made of materials (for example, metals, such as aluminum and copper) that have conductivity. A plurality of the light pipes 116 are provided for one photoelectric conversion unit 115, and are formed so as to pass through the insulating film 112. The light pipes 116 are dielectric bodies (insulators) that have a refractive index different from the insulating film 112. The transfer transistor 117 and the via 114 function as a transmission unit that transfers a signal charge stored in a photoelectric conversion unit 115 to the second substrate 120.

As shown in FIG. 1, the second substrate 120 is configured to have a semiconductor substrate 121 where the photoelectric conversion units 125 and floating diffusion layers 127, 129, and 131 are formed, and a multilayer wiring layer. A multilayer wiring layer-insulating film 122, wiring layers 123 and 133, vias 124 and 132, a light pipe 126, and a transfer transistor 128 (gate electrode) are formed. The photoelectric conversion units 125 are, for example, photodiodes similar to the photoelectric conversion units 115. A plurality of photoelectric conversion units 125 are provided corresponding to one photoelectric conversion unit 115.

The wiring layer 123 is stacked via the insulating film 122, and forms the multilayer wiring layer by connecting respective wiring layers by means of the via 124. In FIG. 1, three wiring layers 123 are formed. Since the wiring layers 123 are used for transmission of signals within the second substrate 120 or supply of a power-source voltage or a ground voltage, the wiring layers are made of materials (for example, metals, such as aluminum and copper) that have conductivity. The via 124 is electrically connected to the via 114 of the first substrate 110 at an interface between the first substrate 110 and the second substrate 120. The via 124 transfers the signal charge, which is transferred from the first substrate 110 to the second substrate 120, to the floating diffusion layer 127. The transfer transistor 128 configures a reading unit (first reading unit) for reading an imaging signal based on the signal charge transferred to the floating diffusion layer 127, from the second substrate 120.

The light pipes 126 are provided for the light pipes 116 in one-to-one correspondence and are formed so as to pass through the insulating film 122. Additionally, the light pipes 126 are provided for the photoelectric conversion units 125 in one-to-one correspondence. The light pipes 126 are dielectric bodies (insulators) that have a refractive index different from the insulating film 122. Preferably, the light pipes 126 are formed of the same material as the light pipe 116. The light pipes 116 and 126 function as waveguides that guide light, which is incident on the solid-state imaging device 100, to the photoelectric conversion units 125. The transfer transistor 130, the via 132, and the wiring layer 133 configure a reading unit (second reading unit) for reading a light field signal based on a signal charge stored in a photoelectric conversion unit 125, from the second substrate 120.

Figure 2:
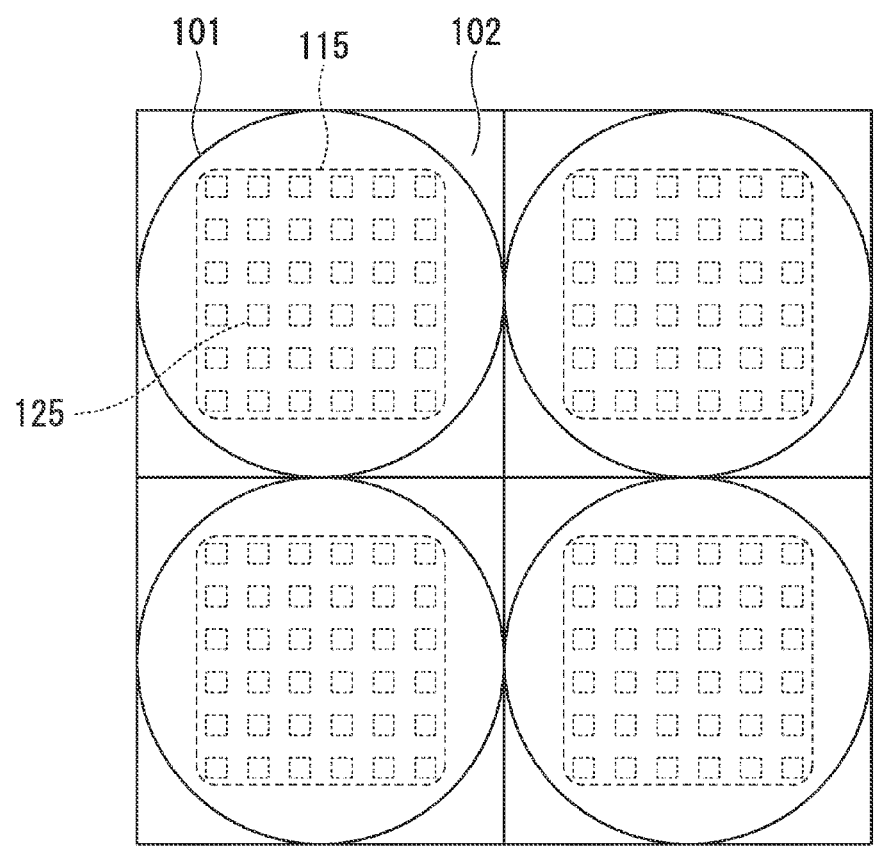
FIG. 2 is a partial plan view of the solid-state imaging device according to the first embodiment of the present invention.

FIG. 2 shows a state where only a portion equivalent to four pixels of the solid-state imaging device 100 shown in FIG. 1 is seen in plan view. Four pixels are arranged in a two-dimensional matrix. One micro lens 101 and one color filter 102 are arranged in a region corresponding to one pixel. When seen from the incidence side of light, one photoelectric conversion unit 115 is arranged inside a region where the micro lens 101 is arranged. Additionally, a plurality of photoelectric conversion units 125 are arranged in a region where the photoelectric conversion unit 115 is arranged. In FIG. 2, the photoelectric conversion units 125 of 6 rows and 6 columns are arranged for one micro lens 101.

Light incident on the solid-state imaging device 100 is condensed by the micro lens 101 and is incident on the photoelectric conversion unit 115 via the color filter 102. This light is photoelectrically converted by the photoelectric conversion unit 115, and a signal charge according to the quantity of light is generated. The signal charge generated by the photoelectric conversion unit 115 is transferred to the floating diffusion layer 118 via the transfer transistor 117. The signal charge transferred to the floating diffusion layer 118 is transferred to the floating diffusion layer 127 via the multilayer wiring layer of the first substrate 110 and the multilayer wiring layer of the second substrate 120. The signal charge transferred to the floating diffusion layer 127 is transferred to the floating diffusion layer 129 via the transfer transistor 128, is turned into a voltage signal by a circuit (not shown), and is output as an imaging signal.

Additionally, a portion of light incident on the solid-state imaging device 100 is transmitted through the first substrate 110 and the insulating film 122 of the second substrate 120 via the light pipes 116 and 126, and is incident on a photoelectric conversion unit 125 of the second substrate 120.

This light is photoelectrically converted by the photoelectric conversion unit 125, and a signal charge according to the quantity of light is generated. The signal charge generated by the photoelectric conversion unit 125 is transferred to the floating diffusion layer 131 via the transfer transistor 130. The signal charge transferred to the floating diffusion layer 131 is transferred via the via 132 and the wiring layer 133, is turned into a voltage signal by a circuit (not shown), and is output as a light field signal.

Figure 3:
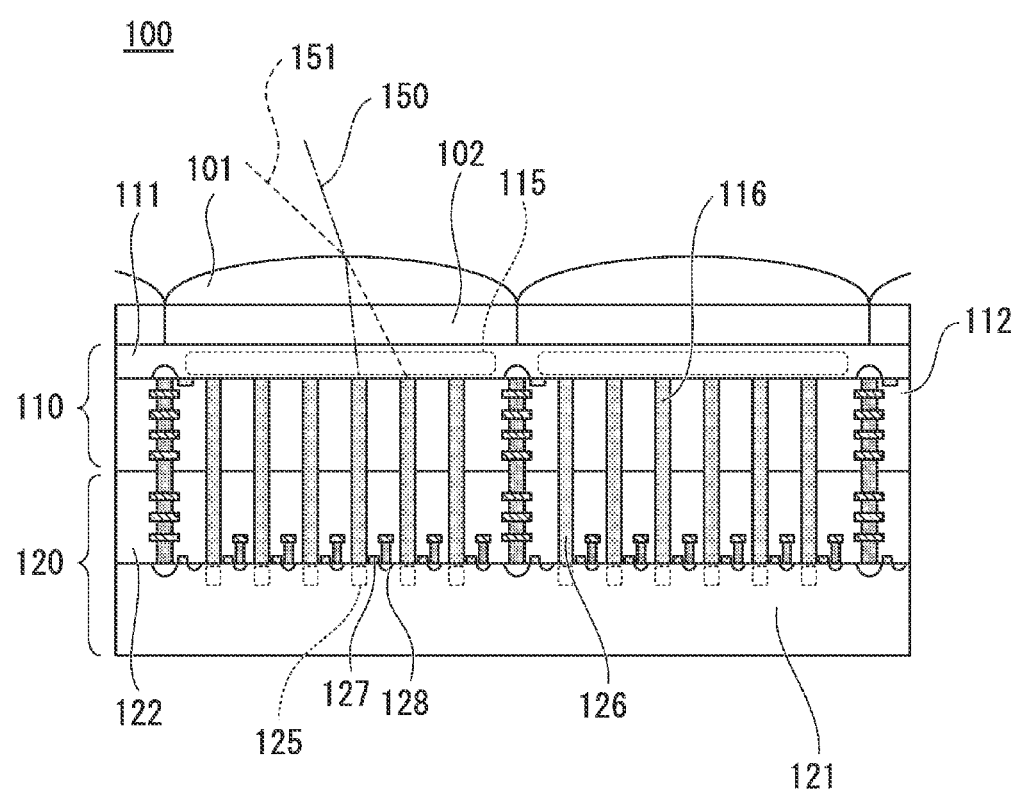
FIG. 3 is a partial cross-sectional view of the solid-state imaging device according to the first embodiment of the present invention.

A portion of light that is incident on the solid-state imaging device 100 and that is transmitted through the micro lens 101 and the color filter 102 is incident on a light pipe 116 provided at a position according to the angle of incidence on the micro lens 101. For example, as shown in FIG. 3, a light ray 150 incident on the micro lens 101 at a first incidence angle, and a light ray 151 incident on the micro lens 101 at a second incidence angle are refracted by the micro lens 101, and are incident on different light pipes 116 according to the respective incidence angles. Selecting the light incident on the photoelectric conversion units 125 in two dimensions by the micro lens 101 and the light pipes 116 is equal to selecting the light ray angles of the light incident on the solid-state imaging device 100. Hence, a signal obtained by a photoelectric conversion unit 125 corresponds to the light ray angle of the light incident on the solid-state imaging device 100.

As described above, according to the present embodiment, the photoelectric conversion unit 115 for obtaining the imaging signal and the photoelectric conversion unit 125 for obtaining the light field signal are arranged on different substrates, respectively. Thus, it is possible to form the photoelectric conversion units 115 with a sufficient size to obtain the imaging signal.

For this reason, the light field signal can be acquired without sacrificing the S/N ratio of the imaging signal.

Additionally, the imaging signal can be read via the transfer transistor 128 provided at the second substrate 120. Additionally, the light field signal can be read via the transfer transistor 130, the via 132, and the wiring layer 133 provided at the second substrate 120. Moreover, as the light pipes 116 and 126 are provided, light can be guided to the photoelectric conversion unit 125 while reducing the crosstalk of light incident on the solid-state imaging device 100. Moreover, the light pipes 116 and 126 can be realized by a post-process of a semiconductor process by forming the light pipes 116 and 126 of insulators.

Second Embodiment

Figure 4:
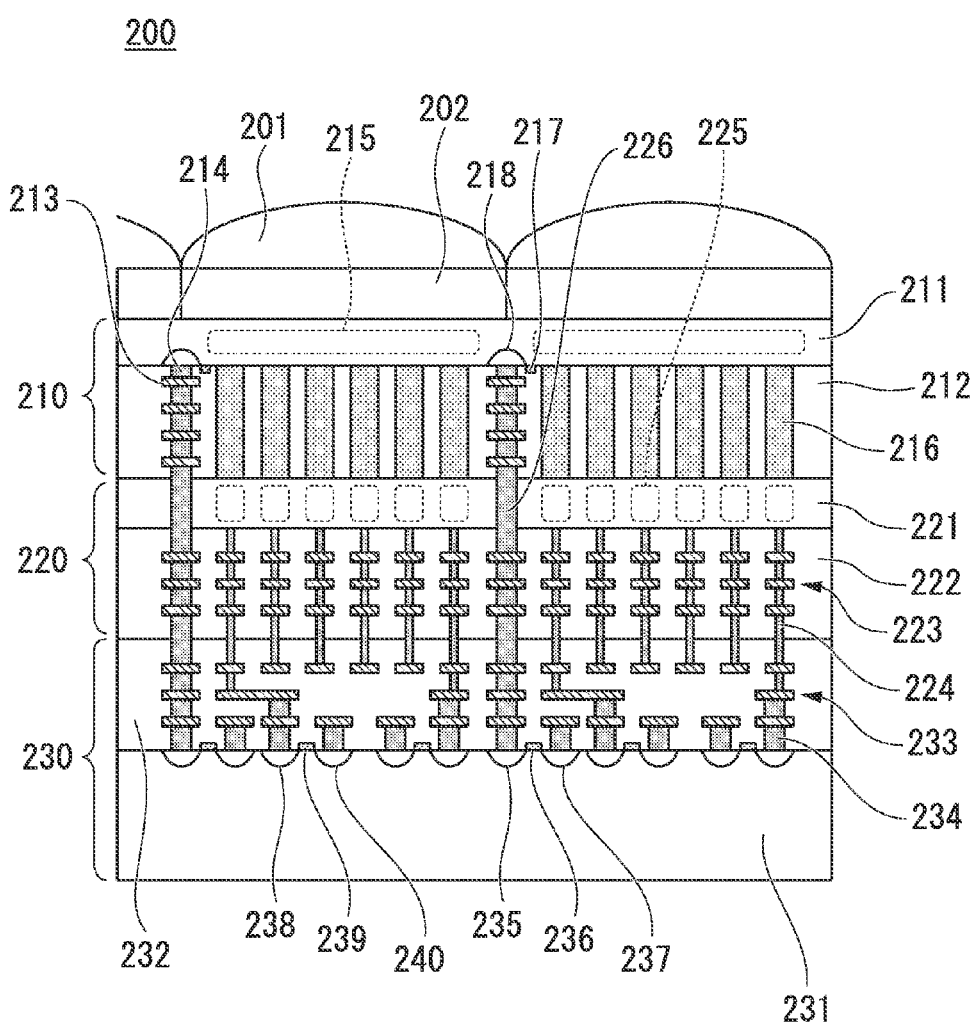
FIG. 4 is a partial cross-sectional view of a solid-state imaging device according to a second embodiment of the present invention.

Next, a second embodiment of the present invention will be described. FIG. 4 shows the configuration of a solid-state imaging device 200 according to the present embodiment in a cross-sectional view. The solid-state imaging device 200 is configured to have a first substrate 210 where a plurality of photoelectric conversion units 215 (first photoelectric conversion units) are formed, a second substrate 220 where a plurality of photoelectric conversion units 225 (second photoelectric conversion units) are formed, and a third substrate 230 where a plurality of MOS transistors for reading signals are formed. The first substrate 210, the second substrate 220, and the third substrate 230 have a stacked structure, and are overlapped on each other and bonded together so that mutual principal surfaces face each other. Light is incident from the upper side in the drawing, and a micro lens 201 that images the light from a subject and a color filter 202 corresponding to a predetermined color are formed on the surface of the first substrate 210.

As shown in FIG. 4, the first substrate 210 is configured to have a semiconductor substrate 211 where the photoelectric conversion units 215 and a floating diffusion layer 218 are formed, and a multilayer wiring layer. The multilayer wiring layer has an insulating film 212, a wiring layer 213, a via 214, a light pipe 216 (selector), and a transfer transistor 217 (gate electrode). The photoelectric conversion units 215 are, for example, embedded photodiodes configured by an N-type well that is formed in a P-type well layer and a P+-type impurity region that has contact with the N-type well and is formed on the surface side of the P-type well layer.

The wiring layer 213 is stacked via the insulating film 212, and forms the multilayer wiring layer by connecting respective wiring layers by means of the via 214. In FIG. 4, four wiring layers 213 are formed. Since the wiring layers 213 are used for transmission of signals within the first substrate 210 or supply of a power-source voltage or a ground voltage, the wiring layers are made of materials (for example, metals, such as aluminum and copper) that have conductivity. A plurality of the light pipes 216 are provided for one photoelectric conversion unit 225, and are formed so as to pass through the insulating film 212. The light pipes 216 are dielectric bodies (insulators) that have a refractive index different from the insulating film 212. The light pipes 216 function as waveguides that guide light, which is incident on the solid-state imaging device 200, to the photoelectric conversion units 225. The transfer transistor 217 and the via 214 function as a transmission unit (first transmission unit) that transfers a signal charge stored in a photoelectric conversion unit 215 to the second substrate 120.

As shown in FIG. 4, the second substrate 220 is configured by a semiconductor substrate 221 where the photoelectric conversion units 225 and a through via 226 are formed, and a multilayer wiring layer where an insulating film 222, wiring layers 223, and a via 224 are formed. The photoelectric conversion units 225 are, for example, photodiodes similarly to the photoelectric conversion units 215. A plurality of photoelectric conversion units 225 are provided corresponding to one photoelectric conversion unit 215.

The through via 226 is electrically connected to the via 214 of the first substrate 210 at an interface between the first substrate 210 and the second substrate 220, and is electrically connected to the via 224 of the second substrate 220 at an interface between the semiconductor substrate 211 and the insulating film 222. The through via 226 is insulated from the semiconductor substrate 221.

The wiring layer 223 is stacked via the insulating film 222, and forms the multilayer wiring layer by connecting respective wiring layers by means of the via 224. In FIG. 4, three wiring layers 223 are formed. Since the wiring layers 223 are used for transmission of signals within the second substrate 220 or supply of a power-source voltage or a ground voltage, the wiring layers are made of materials (for example, metals, such as aluminum and copper) that have conductivity. The multilayer wiring layer including the insulating film 222, the wiring layers 223, and the via 224 has a multilayer wiring layer that transfers the signal charge generated by the photoelectric conversion unit 215, and a multilayer wiring layer that transfers a signal charge generated by a photoelectric conversion unit 225. The through via 226 functions as a transmission unit (second transmission unit) that transfers the signal charge transferred from the first substrate 210, to the third substrate 230. The via 224 functions as a transmission unit (third transmission unit) that transfers the signal charge generated by the photoelectric conversion unit 225, to the third substrate 230.

As shown in FIG. 4, the third substrate 230 is configured to have a semiconductor substrate 231 where floating diffusion layers 235, 237, 238, and 240 are formed, and a multilayer wiring layer. The multilayer wiring layer has an insulating film 232, a wiring layer 233, a via 234, and transfer transistors 236 and 239 (gate electrodes). The wiring layer 233 is stacked via the insulating film 232, and forms the multilayer wiring layer by connecting respective wiring layers by means of the via 234. In FIG. 4, three wiring layers 233 are formed. Since the wiring layers 233 are used for transmission of signals within the third substrate 230 or supply of a power-source voltage or a ground voltage, the wiring layers are made of materials (for example, metals, such as aluminum and copper) that have conductivity. The via 234 and the via 224 are electrically connected to each other at an interface between the second substrate 220 and the third substrate 230. The multilayer wiring layer including the insulating film 232, the wiring layers 233, and the via 234 has a multilayer wiring layer that transfers the signal charge generated by the photoelectric conversion unit 215, and a multilayer wiring layer that transfers the signal charge generated by the photoelectric conversion unit 225.

The transfer transistor 236 configures a reading unit (first reading unit) for reading an imaging signal based on the signal charge transferred to the floating diffusion layer 235, from the third substrate 230. Additionally, the transfer transistor 239 configures a reading unit (second reading unit) for reading the light field signal based on the signal charge stored in the photoelectric conversion unit 225, from the third substrate 230.

Figure 5:
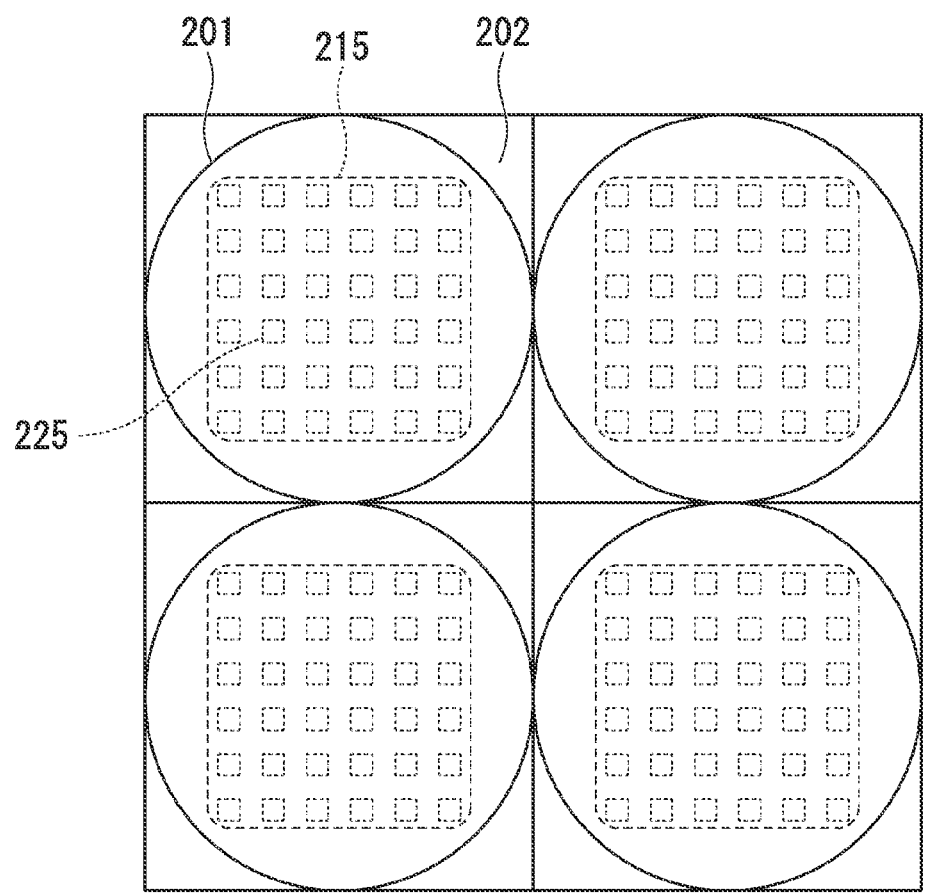
FIG. 5 is a partial plan view of the solid-state imaging device according to the second embodiment of the present invention.

FIG. 5 shows a state where only a portion equivalent to four pixels of the solid-state imaging device 200 shown in FIG. 4 is seen in a plan view. Four pixels are arranged in a two-dimensional matrix. One micro lens 201 and one color filter 202 are arranged in a region corresponding to one pixel. When seen from the incidence side of light, one photoelectric conversion unit 215 is arranged inside a region where the micro lens 201 is arranged. Additionally, a plurality of photoelectric conversion units 225 are arranged in a region where the photoelectric conversion unit 215 is arranged. In FIG. 5, the photoelectric conversion units 225 of 6 rows and 6 columns are arranged for one micro lens 201.

Light incident on the solid-state imaging device 200 is condensed by the micro lens 201 and is incident on the photoelectric conversion unit 215. This light is photoelectrically converted by the photoelectric conversion unit 215, and a signal charge according to the quantity of light is generated. The signal charge generated by the photoelectric conversion unit 215 is transferred to the floating diffusion layer 218 via the transfer transistor 217. The signal charge transferred to the floating diffusion layer 218 is transferred to the floating diffusion layer 235 via the multilayer wiring layer of the first substrate 210, the through via 226 and multilayer wiring layer of the second substrate 220, and the multilayer wiring layer of the third substrate 230. The signal charge transferred to the floating diffusion layer 235 is transferred to the floating diffusion layer 237 via the transfer transistor 236, is turned into a voltage signal by a circuit (not shown), and is output as an imaging signal.

Additionally, a portion of light incident on the solid-state imaging device 200 is transferred through the first substrate 210 via the light pipe 216, and is incident on a photoelectric conversion unit 225 of the second substrate 220. This light is photoelectrically converted by the photoelectric conversion unit 225, and a signal charge according to the quantity of light is generated. The signal charge generated by the photoelectric conversion unit 225 is transferred to the floating diffusion layer 238 via the multilayer wiring layer of the second substrate 220 and the multilayer wiring layer of the third substrate 230. The signal charge transferred to the floating diffusion layer 238 is transferred to the floating diffusion layer 240 via the transfer transistor 239, is turned into a voltage signal by a circuit (not shown), and is output as a light filed signal.

A portion of light that is incident on the solid-state imaging device 200 and that is transmitted through the micro lens 201 and the color filter 202 is incident on a light pipe 216 provided at a position according to the angle of incidence on the micro lens 201. Selecting the light incident on the photoelectric conversion units 225 in two dimensions by the micro lens 201 and the light pipes 216 is equal to selecting the light lay angles of the light incident on the solid-state imaging device 200.

Hence, a signal obtained by a photoelectric conversion unit 225 corresponds to the light ray angle of the light incident on the solid-state imaging device 200.

As described above, according to the present embodiment, the photoelectric conversion unit 215 for obtaining the imaging signal and the photoelectric conversion unit 225 for obtaining the light field signal are arranged on different substrates, respectively. Thus, it is possible to form the photoelectric conversion unit 215 with a size enough to obtain the imaging signal.

For this reason, the light field signal can be acquired without sacrificing the S/N ratio of the imaging signal.

Additionally, the imaging signal can be read via the transfer transistor 236 provided at the third substrate 230. Additionally, a light field signal can be read via the transfer transistor 239 provided at the third substrate 230. That is, the imaging signal and the light field signal can be read by one third substrate 230.

Moreover, since the reading unit (the transfer transistor 236 and the transfer transistor 239) for reading the imaging signal and the light field signal is arranged at the third substrate 230 that is different from the second substrate 220 where the photoelectric conversion units 225 are arranged, the degree of freedom of a circuit for processing the imaging signal and the light field signal can be enhanced. Thereby, for example, the size of the transistors can be increased or the number of transistors can be increased. Additionally, if the diffusion region of a semiconductor is exposed, noise is generated, and the noise is mixed in the signal charge. However, since the floating diffusion layers 238 and 240 are formed at the third substrate 230, the floating diffusion layers 238 and 240 are not easily exposed as compared to the first embodiment in which the floating diffusion layers 127 and 131 are formed at the second substrate 120, generation of the noise can be reduced.

Additionally, as the light pipe 216 is provided, light can be guided to the photoelectric conversion unit 225 while reducing the crosstalk of light incident on the solid-state imaging device 200. Moreover, the light pipes 216 can be realized by a post-process of a semiconductor process by forming the light pipe 216 of an insulator.

Third Embodiment

Figure 6:
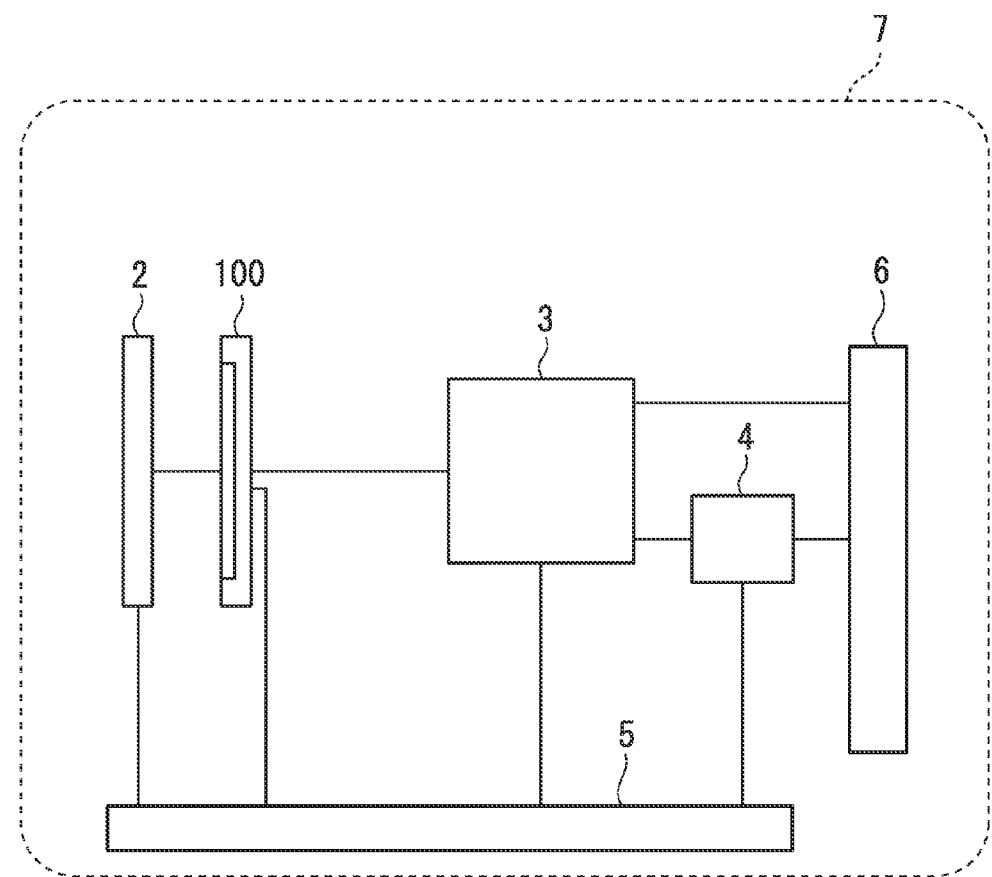
FIG. 6 is a block diagram showing the configuration of an imaging apparatus according to a third embodiment of the present invention.

Next, in a third embodiment of the present invention, an imaging apparatus equipped with the solid-state imaging device 100 of the first embodiment or the solid-state imaging device 200 of the second embodiment will be described. FIG. 6 is a block diagram showing the schematic configuration of the imaging apparatus (for example, digital single-lens camera) equipped with the solid-state imaging device 100 of the first embodiment.

The imaging apparatus 7 shown in FIG. 6 is configured to have a lens unit section 2, a solid-state imaging device 100, an image signal processing device 3, a recording device 4, a camera control device 5, and a display device 6.

In the lens unit section 2, driving of a zoom, a focus, a diaphragm, and the like is controlled by the camera control device 5, and a subject image is formed on the solid-state imaging device 100. The solid-state imaging device 100 is driven and controlled by the camera control device 5, subject light incident on the solid-state imaging device 100 via the lens unit section 2 is converted into electrical signals, and image signals according to the amount of incident light are output to the image signal processing device 3.

The image signal processing device 3 processes signal amplification, conversion into image data, and various corrections, compression of image data, and the like on the image signals input from the solid-state imaging device 1. The image signal processing device 3 uses a memory (not shown) as temporary storage means of the image data in each processing. The recording device 4 is a detachable recording medium, such as a semiconductor memory, and performs recording or reading of the image data. The display device 6 is a display device, such as liquid crystal, which displays an image that is formed on the solid-state imaging device 1 and is based on the image data processed by the image signal processing device 3 or the image data read from the recording device 4. The camera control device 5 is a control device that controls the overall imaging apparatus 7.

Although the imaging apparatus 7 shown in FIG. 6 is equipped with the solid-state imaging device 100 of the first embodiment, it is also possible to equip the imaging apparatus with the solid-state imaging device 200 of the second embodiment instead of the solid-state imaging device 100.

As described above, the imaging apparatus of the present embodiment is equipped with the solid-state imaging device 100 of the first embodiment or the solid-state imaging device 200 of the second embodiment. Accordingly, since the photoelectric conversion unit for obtaining the imaging signal and the photoelectric conversion unit for obtaining the light field signal are arranged on different substrates, respectively, the imaging apparatus that can acquire the light field signal can be provided without sacrificing the S/N ratio of the imaging signal.

While preferred embodiments of the present invention have been described and illustrated above, it should be understood that these are exemplary of the present invention and are not to be considered as limiting. Additions, omissions, substitutions, and other modifications can be made without departing from the spirit or scope of the present invention. Accordingly, the present invention is not to be considered as being limited by the foregoing description, and is only limited by the scope of the appended claims.

What is claimed is:

1. A solid-state imaging device comprising:
   a first substrate which has a plurality of first photoelectric conversion units arranged in two dimensions;
   a second substrate which has a plurality of second photoelectric conversion units arranged in two dimensions and is stacked on the first substrate; and
   a selector which selects the angle of a light ray that is transmitted through the first substrate and is incident on the second photoelectric conversion units,
   wherein the plurality of second photoelectric conversion units are arranged in a region of the second substrate corresponding to a region of the first substrate where one first photoelectric conversion unit among the plurality of first photoelectric conversion units is arranged, and
   wherein imaging signals based on signal charges stored in the first photoelectric conversion units are read and light field signals based on signal charges stored in the second photoelectric conversion units are read.

2. The solid-state imaging device according to claim 1,
   wherein the first substrate further includes a transmission unit that transfers the signal charges to the second substrate, and
   wherein the second substrate further includes:
      a first reading unit that reads the imaging signals transferred by the transmission unit; and
      a second reading unit that reads the light field signals.

3. The solid-state imaging device according to claim 1, further comprising:
   a third substrate,
   wherein the first substrate further includes a first transmission unit that transfers the signal charges to the second substrate,
   wherein the second substrate further includes:
      a second transmission unit that transfers the signal charges transferred by the first transmission unit to the third substrate; and
      a third transmission unit that transfers the signal charges stored in the second photoelectric conversion units to the third substrate, and
   wherein the third substrate includes:
      a first reading unit that reads the imaging signals based on the signal charges transferred by the second transmission unit; and
      a second reading unit that reads the light field signals based on the signal charges transferred by the third transmission unit.

4. The solid-state imaging device according to claim 1,
   wherein the selector includes:
      a micro lens that is provided on the first substrate and condenses light incident on the first photoelectric conversion units; and
      a light pipe that is provided at the first substrate and guides the light condensed by the micro lens to a region of the second substrate where the second photoelectric conversion units are arranged.

5. The solid-state imaging device according to claim 2,
   wherein the selector includes:
      a micro lens that is provided on the first substrate and condenses light incident on the first photoelectric conversion units; and
      a light pipe that is provided at the first substrate and guides the light condensed by the micro lens to a region of the second substrate where the second photoelectric conversion units are arranged.

6. The solid-state imaging device according to claim 3,
   wherein the selector includes:
      a micro lens that is provided on the first substrate and condenses light incident on the first photoelectric conversion units; and
      a light pipe that is provided at the first substrate and guides the light condensed by the micro lens to a region of the second substrate where the second photoelectric conversion units are arranged.

7. The solid-state imaging device according to claim 4, wherein the light pipe is an insulator.

8. The solid-state imaging device according to claim 5, wherein the light pipe is an insulator.

9. The solid-state imaging device according to claim 6, wherein the light pipe is an insulator.

10. An imaging apparatus comprising:
    a solid-state imaging device including:
    a first substrate which has a plurality of first photoelectric conversion units arranged in two dimensions;
    a second substrate which has a plurality of second photoelectric conversion units arranged in two dimensions and is stacked on the first substrate; and
    a selector which selects the angle of a light ray that is transmitted through the first substrate and is incident on the second photoelectric conversion units,
    wherein the plurality of second photoelectric conversion units are arranged in a region of the second substrate corresponding to a region of the first substrate where one first photoelectric conversion unit among the plurality of first photoelectric conversion units is arranged, and
    wherein imaging signals based on signal charges stored in the first photoelectric conversion units are read and light field signals based on signal charges stored in the second photoelectric conversion units are read.

\* \* \* \* \*